(12) United States Patent
Einbrodt et al.

(10) Patent No.: US 7,535,074 B2
(45) Date of Patent: May 19, 2009

(54) MONOLITHICALLY INTEGRATED VERTICAL PIN PHOTODIODE USED IN BICMOS TECHNOLOGY

(75) Inventors: Wolfgang Einbrodt, Erfurt (DE); Horst Zimmermann, Vienna (AT); Michael Foertsch, Vienna (AT)

(73) Assignee: X-Fab Semiconductor Foundries AG, Erfurt (DE)

( * ) Notice: Subject to any disclaimer, the term of this patent is extended or adjusted under 35 U.S.C. 154(b) by 256 days.

(21) Appl. No.: 10/534,304

(22) PCT Filed: Nov. 12, 2003

(86) PCT No.: PCT/DE03/03739

§ 371 (c)(1),
(2), (4) Date: Sep. 8, 2006

(87) PCT Pub. No.: WO2004/044994

PCT Pub. Date: May 27, 2004

(65) Prior Publication Data

US 2007/0018268 A1      Jan. 25, 2007

(30) Foreign Application Priority Data

Nov. 12, 2002   (DE)   ................. 102 52 878

(51) Int. Cl.
*H01L 29/868* (2006.01)
(52) U.S. Cl. ................. 257/458; 257/656; 257/E29.336
(58) Field of Classification Search ................. 257/458, 257/656, E29.336
See application file for complete search history.

(56) References Cited

U.S. PATENT DOCUMENTS

| 4,616,247 | A | * | 10/1986 | Chang et al. | ................. 257/438 |
| 5,164,813 | A | * | 11/1992 | Blackstone et al. | ......... 257/623 |
| 6,392,383 | B1 | | 5/2002 | Sahara et al. | |

(Continued)

FOREIGN PATENT DOCUMENTS

JP          63174358 A2      7/1988

(Continued)

OTHER PUBLICATIONS

PCT Int'l Search Report, Feb. 16, 2005, for information only.

(Continued)

*Primary Examiner*—Davienne Monbleau
*Assistant Examiner*—Benjamin Tzu-Hung Liu
(74) *Attorney, Agent, or Firm*—Duane Morris LLP

(57) ABSTRACT

The invention relates to a monolithically integrated vertical pin photodiode which is produced according to BiCMOS technology and comprises a planar surface facing the light and a rear face and anode connections located across p areas on a top face of the photodiode. An i-zone of the pin photodiode is formed by combining a low doped first p-epitaxial layer, which has maximum thickness and doping concentration, placed upon a particularly high doped p substrate, with a low doped second n⁻ epitaxial layer that borders the first layer, and n⁺ cathode of the pin photodiode being integrated into the second layer. The p areas delimit the second n epitaxial layer in a latent direction while another anode connecting area of the pin diode is provided on the rear face in addition to the anode connection.

26 Claims, 2 Drawing Sheets

U.S. PATENT DOCUMENTS 6,724,018 B2 * 4/2004 Ando et al. ............ 257/186

FOREIGN PATENT DOCUMENTS

| JP | 09148617 | A2 | 6/1997 |
| WO | WO 02/33755 | A1 | 4/2002 |
| WO | WO 02/49120 | A1 | 6/2002 |
| WO | WO 02/067339 | A1 | 8/2002 |

OTHER PUBLICATIONS

German Search Report, May 25, 2004, for information only.

Foertsch, M.; "220 MHz optical receiver with large-area integrated PIN photodiode". Proceedings of IEEE Sensors 2003; Bd. vol. 2 of 2, Conf. 2.

Foertsch, M.; "Integrated PIN photodiodes in high-performance BiCMOS technology". Int'l Electron Devices Meeting 2002.

Hohenbild, M.; "Advanced photodiodes and circuits for OPTO-ASICs". 2001 International Symposium on Electron Devices for Microwave and Optoelectronic Devices.

Kuchta, D.; "Performance of fiber-optic data links using 670-nm cw VCSELs and a monolithic Si photodetector and CMOS preamplifier". IBM Jrnl. Res. Develop. 39, pp. 63-72, 1995.

Kyomasu, M.; "Development of an integrated high speed silicon PIN photodiode sensor". IEEE Trans. On Electron Dev., vol. 42, No. 6 pp. 1093-1099, Jun. 1995.

Lim, P.; "A 3.3-V monolithic photodetector/CMOS preamplifier for 532 Mb/s optical data link applications". Digest Technical Papers ISSCC 1993, pp. 96-97.

Yamamoto, M.; "Si-OEIC with aq built-in pin-photodiode". IEEE Trans. Electron Dev. 42 (1), pp. 58-63, 1995.

Yang, M.; "A high-speed, high sensitivity silicon lateral trench photodetector". IEEE Electron Dev. Lett., pp. 395-397, 2002.

Zimmerman, H.; "Monolithic high-speed CMOS-photoreceiver". IEEE Photonics Technology Letters 11, pp. 254-256, 1999.

Zimmerman, H.; "Monolithic bipolar-, CMOS-, and BiCMOS-receiver OEICs". 1996 International Semiconductor Conference; Bd. vol. 2, Conf. 19.

* cited by examiner

Table 1

|  | standard process | | modified Process | |
|---|---|---|---|---|
| optical wavelength λ | 670 nm | 785 nm | 670 nm | 785 nm |
| quantum efficiency η (%) | 94.3 | 71.3 | 96.5 | 63.4 |
| sensitivity R (A/W) | 0.508 | 0.450 | 0.520 | 0.400 |
| rise time $t_R$ (ns) | 3.00 | 12.40 | 0.610 | 1.465 |
| fall time $t_F$ (ns) | 6.50 | 10.40 | 0.515 | 1.480 |
| 3dB bandwith BW (MHz) | 79.3 | 30.8 | 625 | 238 |
| capacitance $C_D$ (fF/µm$^2$) | 0.134 | 0.134 | 0.0105 | 0.0105 |

MONOLITHICALLY INTEGRATED VERTICAL PIN PHOTODIODE USED IN BICMOS TECHNOLOGY

FIELD OF THE INVENTION

The present invention relates to an improved vertical PIN photodiode monolithically integrated in a biCMOS technology and to a method of forming the same.

BACKGROUND OF THE INVENTION

Discrete PIN photodiodes having a slightly doped i-zone with a thickness of several tens of micrometers formed in silicon technology represent prior art. With PIN photodiodes monolithically integrated into silicon chips, however, the problem to be solved is that the dopant concentration of the substrate ranges from $10^{15}$ cm$^{-3}$ and even higher for CMOS wells and n-collectors/epitaxial layers of npn transistors formed in bipolar and biCMOS technology. For this reason, in non-modified SBC (standard buried collector) technology, processes based on bipolar and biCMOS technology, merely PIN photodiodes are feasible which have a thin i-zone (approximately 1 μm in sophisticated processes), thereby resulting in a low efficiency of approximately 26% at 650/670 nm and even less at longer wavelengths (approximately 10% efficiency at 850 nm), as is, for example disclosed by Lim et al., Digest Technical Papers, ISSCC, 1993, pages 696 to 697 and by Kuchta et al., IBM Journal Res. Develop. 39, pages 63 to 72, 1995.

This problem was solved for PIN diodes integrated into bipolar circuitry on silicon substrates by a sophisticated epitaxial process including an intermediate step which was additionally introduced into the overall process, so as to form a 15 μm thick slightly doped i-zone, cf. Yamamoto et al, IEEE Trans. Electron. Dev. 42(1), pages 58-63, 1995. For this purpose, at least three additional masking steps are necessary, thereby significantly contributing to production costs of the process. Another approach in this respect represent so-called lateral trench PIN photodiodes, cf. Yang et al., IEEE Electron. Dev. Lett., pages 395-397, 2002, this approach, however, requiring additional efforts in the integration scheme.

In the CMOS technology, the PIN photodiode integration is already solved, cf. Zimmermann, IEEE Photonics Technology Letters 11, pages 254-256. Here, the i-zone is realized by a slightly doped n-epitaxial layer deposited on the n$^+$ substrate. To this end an additional masking step is necessary.

SUMMARY OF THE INVENTION

It is an object of the present invention and, thus, the problem underlying the present invention is, to enhance a vertical integrated photodiode formed in biCMOS technology with respect to its operating speed and its efficiency without (substantially) increased efforts involved in the manufacturing process.

The present invention provides for an improvement of the data of OEIC (optoelectronic integrated circuits), which are based on the biCMOS technology, thereby allowing an extension of its applications.

According to the present invention, this object is solved by forming the i-zone of the PIN diode (or PIN photodiode) by means of the combination of a p$^-$ epitaxial layer having a thickness up to 15 μm and having a low dopant concentration of particularly approximately $10^{13}$ cm$^{-3}$ (for a thinner p$^-$ epitaxial layer a higher dopant concentration is sufficient) which is located on the highly doped p$^+$ substrate, with a doped n$^-$ epitaxial layer preferably substantially doped at $10^{14}$ cm$^{-3}$ that is located adjacent to the former epitaxial layer and into which the n$^+$ cathode of the PIN photodiode is incorporated, and by laterally bordering the n– epitaxial layer by p well regions in the lateral direction, and by providing buried p layers located under the p well regions, which extend into the p epitaxial layer.

In addition to the anode terminals via the p wells used for the lateral insulation of the PIN photodiode on the top surface of the chip, an anode contact (as an area or as a contact) is provided on the bottom side of the chip. To this end, at least in this back side anode area, the substrate may be thinned.

The back side contact may be omitted, if the serial resistance of the photodiode having an anode on the planar front surface, which is contacted in a precisely known manner, is not too great. For example, deep trench contacts may be formed from the top so as to reduce the serial resistance.

For a deeper understanding as to how such a photodiode structure requiring minimum additional technological efforts may be realized in biCMOS technology, the essential parts of the employed biCMOS standard processes used for this purpose shall be briefly discussed.

The initial material used for the biCMOS standard process is a p silicon wafer having a specific electric resistance of, for example, 20 Ohm cm (Ωcm). After the implementation of a buried layer, a moderately highly doped n epitaxial layer having, for instance, a dopant concentration of $10^{15}$ cm$^{-3}$, with a thickness of approximately 1 μm is deposited on the substrate. During the further processing, n and p wells (CMOS wells) will be implanted as regions into the n epitaxial layer. The n well simultaneously serves the purpose of generating the collector doping of the npn transistors. The dopant concentration of the n well is higher than that of the n epitaxial layer.

According to the present invention, the formation of the PIN photodiode may be performed in that a p$^+$ silicon wafer is used as initial or base material, wherein the wafer has formed thereon a p$^-$ epitaxial layer with a thickness of approximately 15 μm and a low dopant concentration of preferably substantially $10^{13}$ cm$^{-3}$. The standard n epitaxial layer following the implementation of the buried layer is deposited with a dopant concentration that is lowered to a range of approximately $10^{14}$ cm$^{-3}$. For both of these process modifications, no additional mask is necessary, since the biCMOS standard process includes the option of masking the n and p wells, as well as the buried layer with respect to the region of the photodiode.

In order to avoid a higher serial resistance of the PIN photodiode, not only the p well used for the lateral insulation of the PIN photodiode is used as an anode terminal, but also an additional backside contact of the bottom side of the substrate may be used, which may optionally, at least in this area, be thinned. It is sufficient, for example, to attach the thinned chip to a lead frame or a conductive area of a wiring board by means of a conductive adhesive. The present invention will be illustrated in more detail by means of schematic drawings and exemplary embodiments.

Table 1 depicts measurement results and a comparison.

Figure 2:
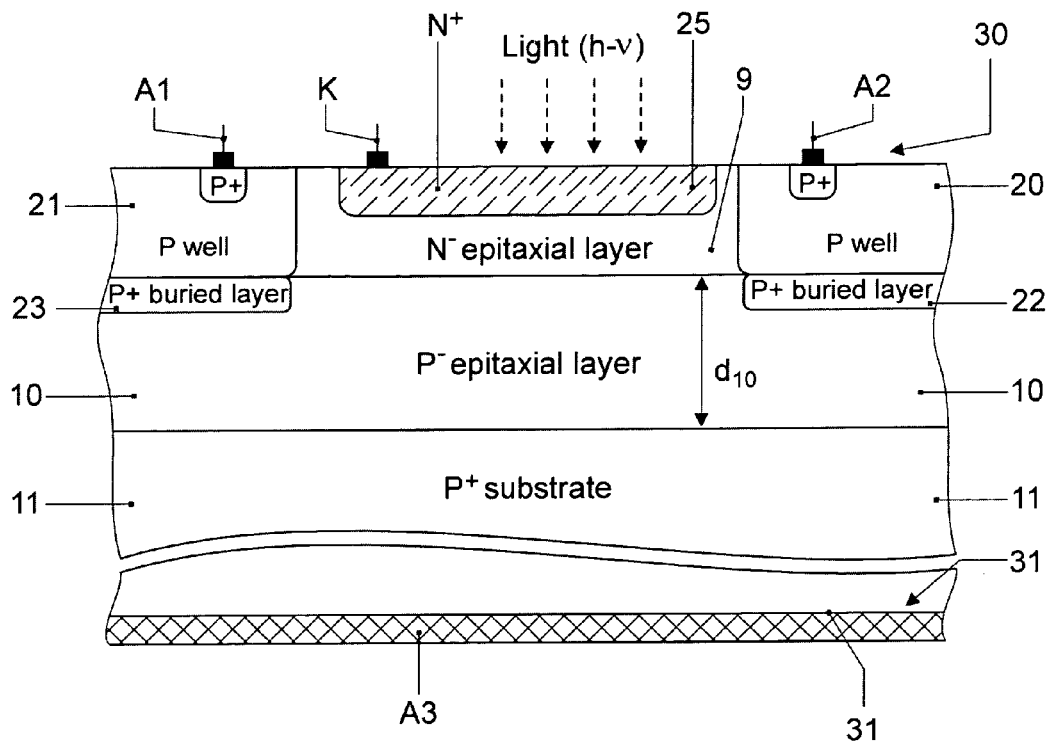

FIG. 2 illustrates, in a second exemplary embodiment, the structure of a PIN photodiode.

Figure 3:
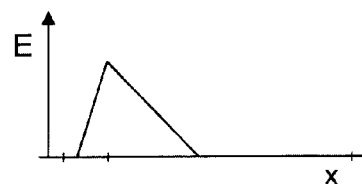
Figure 3:
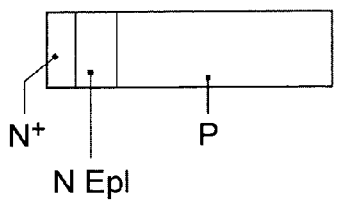

FIG. 3 represents the progression of the electric field as is obtained with the conventional biCMOS standard process for the PIN diode region.

Figure 1:
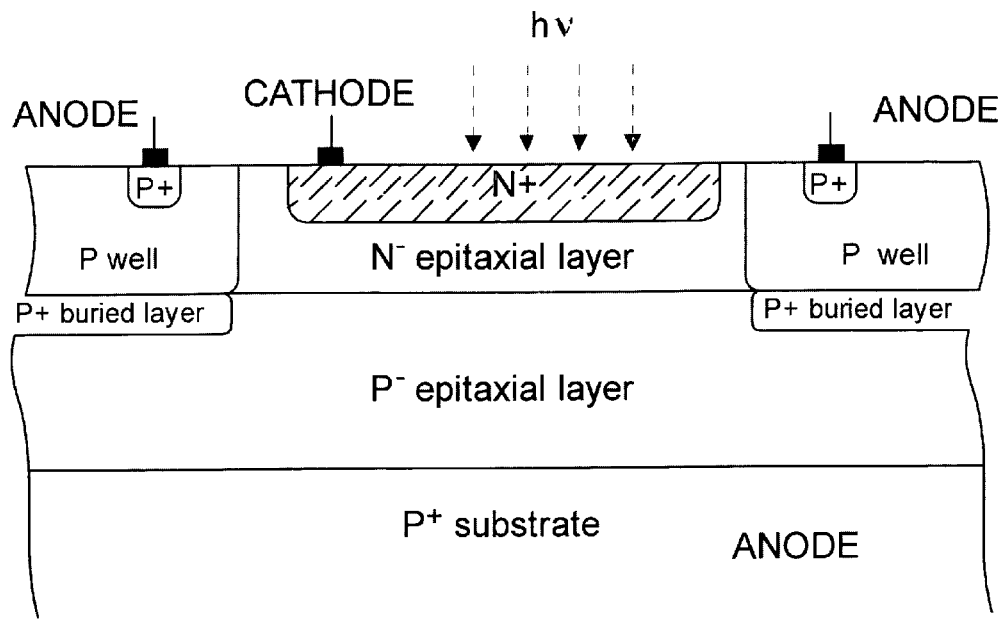
FIG. 1 illustrates the structure of a PIN diode in one exemplary embodiment.
Figure 4:
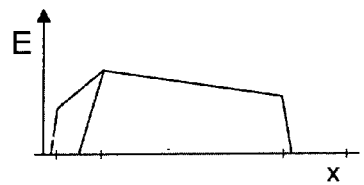
Figure 4:
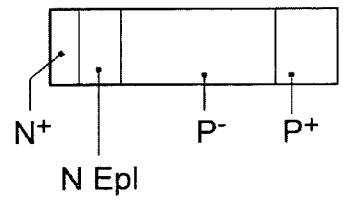

FIG. 4 depicts the progression of the electric field as is obtained for the PIN diode region according the structure of FIG. 1 or FIG. 2 (solid line) and for the case that the dopant concentration in the n epitaxial layer 9 is not reduced to an amount of substantially $10^{14}$ cm$^{-3}$ to $10^{15}$ cm$^{-3}$ (dashed line). This indicates that the p$^-$ epitaxial 10 layer alone would not resolve the problem.

DETAILED DESCRIPTION OF THE INVENTION

Table 1 includes the measurement results of photodiodes implemented by a non-modified and a modified biCMOS process, respectively. It is evident that according to the modification of the present invention for a wavelength of 670 nm, an integrated photodiode having a quantum efficiency of more than 95% may be obtained, wherein the short rise and fall times allow a processing bit rate of up to 1 Gbit/second. A reduced junction capacity $C_D$ allows for an increased photodiode area, which represents a further advantage.

FIG. 1 illustrates the exemplary embodiment of a monolithically vertical PIN diode formed in biCMOS technology.

Existing layers and structures will be discussed in more detail with reference to a further illustrative embodiment according to FIG. 2. FIG. 2 represents a vertical structure of a PIN photodiode. The intrinsic i-zone is formed by two slightly doped epitaxially grown layers 9, 10. The layer following the substrate 11, is a p-type layer. The further following layer is an n-type layer. To obtain such a structure, a standard biCMOS process with respective modifications is used.

Typically, for the standard process a base material is used starting from a p-type wafer having a specific resistance of approximately 20 Ωcm. Instead of this wafer type, here a modified, but, nevertheless, commercially available, wafer is used having an epitaxially deposited slightly doped p layer with a thickness of, for example 15 μm, wherein the dopant concentration may, for example, be $10^{13}$ cm$^{-3}$. This is the layer 10.

According to the standard process, after the implementation of buried layers 23, 22 a moderately highly doped n layer is formed on the substrate, which may have a thickness of, for example, 1 μm. This epitaxial layer 9 may be doped within a range of $10^{15}$ cm$^{-3}$. During the further processing, n-type and p-type wells are implanted in the same way as in the biCMOS process.

The n-zone 25 (the n$^+$ region) simultaneously serves the purpose of generating the collector doping and provides for the contact or terminal of a cathode K. The doping of the p wells extends into the n layer 9 and into the buried layers 23, 22. The p wells 20, 21 have formed therein p doping zones for receiving the anodes A1, A2.

On the top surface of the silicon wafer accordingly processed, wherein the top surface is denoted as top face or light side 30, the anodes A1, A2 and the cathode, as well as the light receiving collector zone 25 (in the form an n$^+$ region) are provided. This top surface may be provided in a substantially even or planar form.

Oppositely arranged to the top side is provided a bottom side or back side 31 which follows the substrate 11. This back side is also provided with an anode A3, which may be formed as an area anode or as a locally restricted anode. This anode is denoted as a back side anode and forms an anode contact area of the PIN diode at the back side 31, wherein this anode is additional to the anodes A1 and A2 at the light side (top surface). The epitaxial layer 9 is delineated at its edges (laterally) by p regions 20, 21, which are shown in a vertical section.

Structurally, the area of the back side anode may be located higher or deeper, which may be achieved by a thinning or reduction of the thickness of the silicon wafer, which is not illustrated in the drawings.

The formation of the contacts is preferably performed from top side 30 with respect to all of the illustrated anodes A1, A2 and A3.

Trench contacts may be provided so as to form one or more anode terminals or contacts by these trench contacts, in particular, moderately deep contacts. These trenches are not explicitly shown.

The meaning of the notions "highly doped" or "slightly doped", with respect to the grown epitaxial layer 9, is a dopant concentration of approximately $10^{14}$ cm$^{-3}$. The dopant concentration of the first epitaxial layer 10, which is formed on the substrate 11 or which is already present there, is preferably by a low dopant concentration in the range of $10^{13}$ cm$^{-3}$.

If the dopant concentration of the upper most layer 9 is lowered, a fast PIN photodiode is obtained, represented by the short rise and fall times as shown in Table 1. The transistor may not "experience" a great deal of this reduction of the dopant concentration, that is, the transition time and the current gain factor are slightly or hardly changed.

The two modifications with respect to the standard manufacturing process of a biCMOS process reside in the fact that a p wafer having an epitaxially deposited p layer with a low dopant concentration is used as the initial material. This epitaxial layer is slightly doped. The second modification resides in that fact that the dopant concentration of the further epitaxial layer formed thereon, in this case the n layer 9, is also maintained at a low level. For both process modifications, no additional mask is required with respect to the standard process.

Thus, the manufacturing process is already described in full detail with respect to the standard biCMOS manufacturing sequences and the modifications associated therewith by means of the above-specified description. The manufacturing process, nevertheless, shall be summarized. For example, the photodiode of FIG. 2 or a photodiode according to FIG. 1 is formed on the basis of an initial material, which is represented by a p silicon wafer having an epitaxially grown layer 10 with a thickness of substantially 15 μm at most. This layer has a dopant concentration as mentioned above, which may be referred to as a slight or low dopant concentration. Next, an n epitaxial layer 9, which is used in a standard fashion is grown, Its dopant concentration is maintained at a low level, in the range of approximately $10^{14}$ cm$^{-3}$. This growth process of the epitaxial layer 9 is preceded by the formation of the buried layers 22, 23.

Next, the n and p wells are incorporated so as to allow contact with the anodes. Furthermore, all further standard process steps of the specified technology are performed. Hereby, an n$^+$ region 25 is incorporated into the n$^-$ epitaxial layer, wherein the region 25 serves for the contacting of the cathode. This region is denoted as 25 in FIG. 2 and faces the light side and thus, represents the light receiving side or top side 30. Laterally, this region is delineated by a p region 20, 21, which is provided around the cathode region 25 within the epitaxial layer 9 and which extends vertically preferably down to the buried layers 23, 22.

In addition to the aforementioned anodes A1, A2, which are incorporated into the p wells, a further anode A3 is formed on the back side 31.

In one illustrative manufacturing process, after dicing, which is not shown, the present chips resulting from the previously-described method, a conductive adhesive may be deposited so as to attach these chips to a lead frame. The chips may also be attached to a conductive area of a wiring board so as to be electrically contacted thereto. This is done when a serial resistance of the chip is obtained which is not sufficient.

At the front side, a protective covering of the silicon wafer may be used during or prior to thinning of the backside 31, at least within the area of the PIN photodiode of the silicon crystal shown in FIG. 2. The process of thinning may be accomplished by grinding or polishing.

A further alternative is to not specifically form the anode contact area (the backside anode A3) and, thus, to not electrically contact the same. Contacting of the anode, is therefore, performed via the anodes A1, A2 on the top side (light side).

We claim:

1. A monolithically integrated vertical PIN photodiode formed in BICMOS technology and having a substantially planar surface facing the light and having a back side and anode terminals via p regions on a topside of the photodiode, wherein an i-zone of the PIN photodiode is formed by:
   (a) a combination of a first $p^-$ epitaxial layer with a thickness of substantially 15 μm at most and having a dopant concentration of less than $5*10^{14}$ cm$^{-3}$, wherein the $p^-$ epitaxial layer is located on a p substrate;
   (b) a slightly doped $n^-$ epitaxial second layer adjacent to the first layer and having a dopant concentration in a range of substantially $10^{14}$ cm$^{-3}$ to $10^{15}$ cm$^{-3}$, wherein an $n^+$ cathode of the PIN photodiode is incorporated into the second layer; and
   wherein, in lateral direction, said p regions delineate the second layer, and in addition to the anode terminals, a further anode contact area of the PIN diode is provided at the back side.

2. The PIN photodiode of claim 1, wherein buried $p^+$ layers extending into the $p^-$ epitaxial layer are located below the p regions which border the second n epitaxial layer in the lateral direction.

3. The PIN photodiode of claim 2, wherein the p regions are configured as p wells and wherein the p wells extend to the buried layer.

4. The PIN photodiode of claim 1, wherein at least within the further anode contact area, acting as a back side, a silicon wafer bearing the photodiode is thinned.

5. The PIN photodiode of claim 1 wherein the anode of the PIN photodiode is electrically contacted from the frontside only.

6. The PIN photodiode of claim 5, wherein one or more anode terminals are formed by deep trench contacts.

7. The PIN photodiode of claim 1, wherein the slightly doped n epitaxial layer has a dopant concentration of approximately $10^{14}$ cm$^{-3}$.

8. The PIN photodiode of claim 1, wherein the dopant concentration of the first epitaxial layer is substantially $10^{+13}$ cm$^{-3}$.

9. The PIN photodiode of claim 1, wherein the p regions are configured as p wells.

10. The PIN photodiode of claim 9, wherein the wells extend to the first layer.

11. The PIN photodiode of claim 1, wherein a dopant concentration of the second layer is less than a dopant concentration of an n region in the second layer, wherein the n region forms a collector doping for contacting a cathode.

12. The PIN photodiode of claim 1, wherein within and spaced apart from the p regions, a cathode region is provided.

13. The PIN photodiode of claim 1, wherein the $p^-$ epitaxial layer is located on a highly doped $p^+$ substrate.

14. A method for forming a monolithically integrated vertical PIN photodiode according to a BICMOS technology, wherein:
   (i) a $p^+$ silicon wafer having a $p^-$epitaxial layer with a maximum thickness of substantially 15 μm and having a dopant concentration of approximately $10^{13}$ cm$^{-3}$ is used as base material;
   (ii) after a subsequent implementation of a buried layer an $n^-$ epitaxial layer having a dopant concentration within a range of approximately $10^{14}$ cm$^{-3}$ is one of deposited and incorporated; and
   (iii) thereafter, n and p wells are formed and standard following process steps of the technology are performed, wherein in the $n^-$ epitaxial layer an $n^+$ cathode of the PIN photodiode is incorporated, and in a lateral direction p regions delineate the $n^-$ epitaxial layer and wherein in addition to anode terminals via the p regions of a planar top side a further anode contact area is formed on the back side.

15. The method of claim 14, wherein finally the silicon wafer at least within the area of the PIN diode is thinned at the back side with a protective covering formed on the front side.

16. The method of claim 14, wherein the anode contact area of the back side is not particularly formed and is not electrically contacted.

17. The method of claim 14, wherein the back side anode of a chip provided after dicing of the substrate is electrically be contacted by attaching the chip to a lead frame or a conductive area of a wiring board by means of a conductive adhesive, if the serial resistance is not sufficient.

18. A monolithically vertical PIN photodiode formed in BICMOS technology, wherein an i-zone of the PIN diode is formed by the combination of a slightly doped $p^-$epitaxial layer having a thickness up to substantially 15 μm with a dopant concentration of less than $5*10^{14}$ cm$^3$ and being located on a highly doped $p^+$ substrate, with a slightly doped $n^-$epitaxial layer formed adjacent to the $p^-$epitaxial layer and having a dopant concentration in the range of approximately $10^{14}$ cm$^{-3}$, as range of dopant concentration$\leq 10^{14}$ cm$^{-3}$ to$<10^{15}$ cm$^{-3}$, into which the $n^+$ cathode of the PIN photodiode is incorporated, wherein p regions laterally delineate the $n^-$ epitaxial layer in lateral direction and wherein in addition to the anode terminals, via the p well regions of the planar front side, a further anode contact area of the PIN diode is provided at the back side.

19. The monolithically integrated vertical PIN photodiode of claim 18, wherein the range of dopant concentration is substantially $10^{13}$cm$^{-3}$.

20. The monolithically integrated vertical PIN photodiode of claim 18, wherein buried $p^+$ layers extend into the p epitaxial layer and are located below the p regions, which laterally delineate the slightly doped $n^-$ epitaxial layer in lateral direction.

21. The monolithically integrated vertical PIN photodiode of claim 18, characterized in that at least within the back side anode the silicon wafer is thinned.

22. The monolithically integrated vertical PIN photodiode of claim 18, characterized in that the anode of the PIN photodiode is electrically contacted from the front side only.

23. The monolithically integrated vertical PIN photodiode of claim 22, wherein one or more anode terminals are formed by deep trench contacts.

24. A method of forming a monolithically integrated vertical PIN photodiode in BICMOS technology, wherein:

(i) a p$^+$ silicon wafer having formed thereon a p$^-$ epitaxial layer with a thickness of approximately 15 μm and having a dopant concentration of approximately $10^{13}$ cm$^{-3}$ is used as an initial material;

(ii) after a subsequent implementation of a buried layer, an n$^-$ epitaxial layer is deposited according to a standard process flow with a dopant concentration of about $10^{14}$ cm$^{-3}$; and (iii) thereafter, n and p wells are formed and all further standard subsequent process steps of the technology are performed, wherein the n$^+$ cathode of the PIN photodiode is incorporated into the n$^-$ epitaxial layer, wherein in lateral direction p regions laterally delineate an n$^-$ epitaxial layer and wherein in addition to anode terminals, via the p well regions of the planar front side, a further anode contact area of the PIN diode is formed on the back side, such that said further anode contact area of the chip obtained after the dicing of the substrate can be contacted by attaching the chip to a lead frame or a conductive area of a wiring board by means of a conductive adhesive, to support a sufficiently small serial resistance.

25. The method of claim 24, wherein in that in a final step the silicon wafer is thinned at the back side at least within the PIN diode with the front side being covered by a protective covering.

26. The method of claim 24, wherein the anode contact area on the back side not particularly being formed and not electrically being contacted.

* * * * *